(12) United States Patent
Dong et al.

(10) Patent No.: US 10,311,814 B2
(45) Date of Patent: Jun. 4, 2019

(54) ARRAY SUBSTRATE, DISPLAY PANEL, DISPLAY DEVICE AND DISPLAY METHOD

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Zhifu Dong, Beijing (CN); Hongmin Li, Beijing (CN); Ping Song, Beijing (CN); Liqing Liao, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 72 days.

(21) Appl. No.: 15/504,015

(22) PCT Filed: Sep. 9, 2016

(86) PCT No.: PCT/CN2016/098583
§ 371 (c)(1),
(2) Date: Feb. 14, 2017

(87) PCT Pub. No.: WO2017/118076
PCT Pub. Date: Jul. 13, 2017

(65) Prior Publication Data
US 2018/0108310 A1    Apr. 19, 2018

(30) Foreign Application Priority Data

Jan. 4, 2016  (CN) .......................... 2016 1 0003749

(51) Int. Cl.
*G02F 1/135* (2006.01)
*G09G 3/36* (2006.01)
(Continued)

(52) U.S. Cl.
CPC ....... *G09G 3/3648* (2013.01); *G02F 1/13452* (2013.01); *G02F 1/13454* (2013.01);
(Continued)

(58) Field of Classification Search
CPC combination set(s) only.
See application file for complete search history.

(56) References Cited

U.S. PATENT DOCUMENTS

| | | | | |
|---|---|---|---|---|
| 2006/0075368 | A1* | 4/2006 | Bakir | .................. G06F 17/5072 716/122 |
| 2009/0073335 | A1* | 3/2009 | Yagi | .................. G02F 1/133707 349/39 |
| 2015/0214451 | A1* | 7/2015 | Abe | ........................ H01L 33/62 362/382 |

FOREIGN PATENT DOCUMENTS

| | | |
|---|---|---|
| CN | 101819337 A | 9/2010 |
| CN | 101969063 A | 2/2011 |

(Continued)

OTHER PUBLICATIONS

JP-2002075810-A Mar. 2002 Komata, Katsumori.*
(Continued)

*Primary Examiner* — Van N Chow
(74) *Attorney, Agent, or Firm* — Kinney & Lange, P.A.

(57) ABSTRACT

The disclosure provides an array substrate, a display panel, a display device and a display method. The array substrate comprises a display region provided with a plurality of data lines therein and a wiring region around the display region and provided with a plurality of leading wires therein. The plurality of leading wires are connected with the plurality of data lines respectively in a one-to-one correspondence way. The plurality of leading wires comprise a plurality of first leading wires and a plurality of second leading wires insulatively arranged in different layers. The plurality of first leading wires and the plurality of second leading wires (Continued)

comprise at least one pair of overlapped first and second leading wires to which data signals having the same polarity are input.

19 Claims, 4 Drawing Sheets

(51) Int. Cl.
<table>
<tr><td>G02F 1/1345</td><td>(2006.01)</td></tr>
<tr><td>G02F 1/1362</td><td>(2006.01)</td></tr>
<tr><td>G06F 3/041</td><td>(2006.01)</td></tr>
<tr><td>H01L 27/12</td><td>(2006.01)</td></tr>
<tr><td>G02F 1/1333</td><td>(2006.01)</td></tr>
</table>

(52) U.S. Cl.
CPC .. *G02F 1/133345* (2013.01); *G02F 1/136286* (2013.01); *G06F 3/0412* (2013.01); *G09G 3/3677* (2013.01); *H01L 27/124* (2013.01)

(56) References Cited

FOREIGN PATENT DOCUMENTS

<table>
<tr><td>CN</td><td>103293728 A</td><td>9/2013</td></tr>
<tr><td>CN</td><td>103718231 A</td><td>4/2014</td></tr>
<tr><td>CN</td><td>104865756 A</td><td>8/2015</td></tr>
<tr><td>CN</td><td>105427748 A</td><td>3/2016</td></tr>
<tr><td>JP</td><td>2006220832 A</td><td>8/2006</td></tr>
<tr><td>WO</td><td>2013140760 A1</td><td>9/2013</td></tr>
<tr><td>WO</td><td>2014077175 A1</td><td>5/2014</td></tr>
<tr><td>WO</td><td>2014132799 A1</td><td>9/2014</td></tr>
</table>

OTHER PUBLICATIONS

JP-4471475-B2 Jun. 2010.*
First Chinese Office Action, for Chinese Patent Application No. 201610003749.0, dated Jul. 25, 2017, 14 pages.
International Search Report and Written Opinion (including English translation of Box V) dated Nov. 24, 2016, for Corresponding PCT Application No. PCT/CN2016/098583.

* cited by examiner

ARRAY SUBSTRATE, DISPLAY PANEL, DISPLAY DEVICE AND DISPLAY METHOD

CROSS-REFERENCE TO RELATED APPLICATION

This application is a national phase application from PCT/CN2016/098583 filed on Sep. 9, 2016 and claims the benefit of Chinese Patent Application No. CN201610003749.0 filed on Jan. 4, 2016 in the State Intellectual Property Office of China, the whole disclosure of which is incorporated herein by reference.

BACKGROUND OF THE INVENTION

Field of the Invention

Embodiments of the disclosure relate to the field of display technique, and in particular to an array substrate, a display panel, a display device and a display method.

Description of the Related Art

A wiring region of an array substrate in the related art comprises a plurality of first leading wires for data lines and a plurality of second leading wires for data lines insulatively arranged in different layers, and an insulation layer is arranged between the two layers of leading wires. In view of requirements for light-transmission and spaces between the leading wires in the same layer, reduction in the area of the wiring region is limited.

In order to reduce the area of the wiring region, leading wires in different layers are arranged to be overlapped and the two overlapped leading wires are used to connect adjacent data lines. This design greatly reduces a space occupied by the wiring region. However, in a case where data signals introduced through the leading wires are inverted in a way of column inversion or dot inversion, since the adjacent leading wires have opposite polarities, with the above structure of the leading wires, very large capacitance will be generated between the overlapped leading wires, which may increase power consumption and affect image quality.

SUMMARY OF THE INVENTION

The disclosure at least partially solves the above problems in the prior art.

In order to solve the above problems, the disclosure provides an array substrate comprising a display region provided with a plurality of data lines therein and a wiring region around the display region and provided with a plurality of leading wires for the data lines therein. The plurality of leading wires are connected with the plurality of data lines in a one-to-one correspondence way. The plurality of leading wires comprise a plurality of first leading wires and a plurality of second leading wires insulatively arranged in different layers. The plurality of first leading wires and the plurality of second leading wires comprise at least one pair of up-and-down overlapped first and second leading wires through which data signals having the same polarity are introduced.

In an embodiment, two data lines connected with the up-and-down overlapped first and second leading wires are both have an odd-numbered data lines or an even-numbered data lines.

In an embodiment, two data lines connected with the up-and-down overlapped first and second leading wires are interleaved with at least one data line.

In an embodiment, two data lines connected with the up-and-down overlapped first and second leading wires are interleaved with one data line.

In an embodiment, each of the first and second leading wires comprises a leading wire body and a first bended connection end for connecting with the data line, the first bended connection end of the first leading wire has a bending direction opposite to a bending direction of the first bended connection end of the second leading wire, and the first bended connection end of the second leading wire crosses the first bended connection end of a first leading wire adjacent to the first leading wire overlapped with the second leading wire.

In an embodiment, each of the first and second leading wires further comprises a second bended connection end for connecting with a connection terminal of a driving circuit, the second bended connection end of the first leading wire has a bending direction opposite to a bending direction of the second bended connection end of the second leading wire, and the second bended connection end of the second leading wire crosses the second bended connection end of the first leading wire adjacent to the first leading wire overlapped therewith.

In an embodiment, two adjacent data lines have opposite polarities.

In an embodiment, the first leading wires have the same number of leading wires as the second leading wires, and each first leading wire corresponds to one second leading wire overlapped therewith.

In an embodiment, the first leading wires have the same width as the second leading wires.

In an embodiment, the first leading wires have different numbers of leading wires from the second leading wires.

In an embodiment, the array substrate further comprises a base substrate, and orthogonal projections of the up-and-down overlapped first and second leading wires on the base substrate of the array substrate are at least partially overlapped with each other.

In an embodiment, the orthogonal projections of the up-and-down overlapped first and second leading wires on the base substrate of the array substrate are completely overlapped with each other.

In an embodiment, the first leading wires are arranged in the same layer as the data lines, and the second leading wires are connected with the data lines through via holes.

In an embodiment, the data lines are arranged in a different layer from the first and second leading wires, and the first and second leading wires are connected with the data lines through via holes.

The disclosure further provides a display panel comprising the array substrate as described above.

The disclosure further provides a display device comprising the display panel as described above and a driving circuit comprising a plurality of connection terminals connected with the plurality of leading wires respectively in a one-to-one correspondence way. The driving circuit is configured to input data signals having the same polarity to the up-and-down overlapped first and second leading wires through the connection terminals.

The disclosure also provides a display method for use with the display device as described above, comprising inputting data signals having the same polarity to the up-and-down overlapped first and second leading wires.

DETAILED DESCRIPTION OF PREFERRED EMBODIMENTS OF THE INVENTION

Embodiments of the disclosure will be described in detail below with reference to the accompanying drawings. The following descriptions are intended to be illustrative and should not be considered to limit the disclosure.

Figure 1:
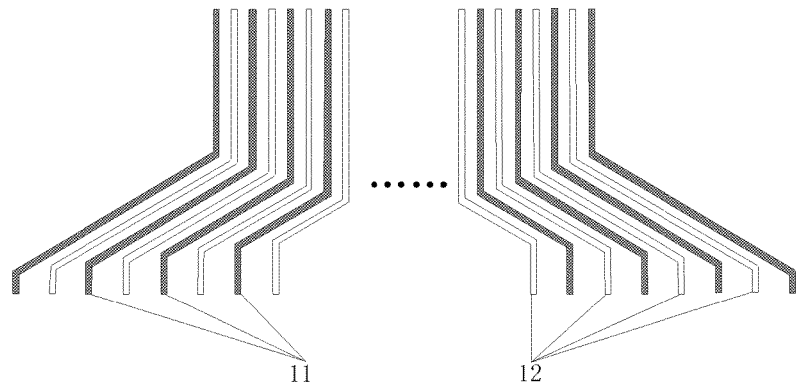
FIG. 1 is a schematic structural view of a wiring region on an array substrate in the related art.

Please refer to FIG. 1, FIG. 1 is a schematic structural view of a wiring region on an array substrate in the related art. The wiring region comprises a plurality of leading wires 11 and a plurality of leading wires 12 insulatively arranged on different layers. An insulation layer is arranged between the two layers of leading wires. In view of requirements for light-transmission and space between the leading wires in the same layer, reduction in the area of the wiring region of the structure shown in FIG. 1 is limited.

Figure 2:
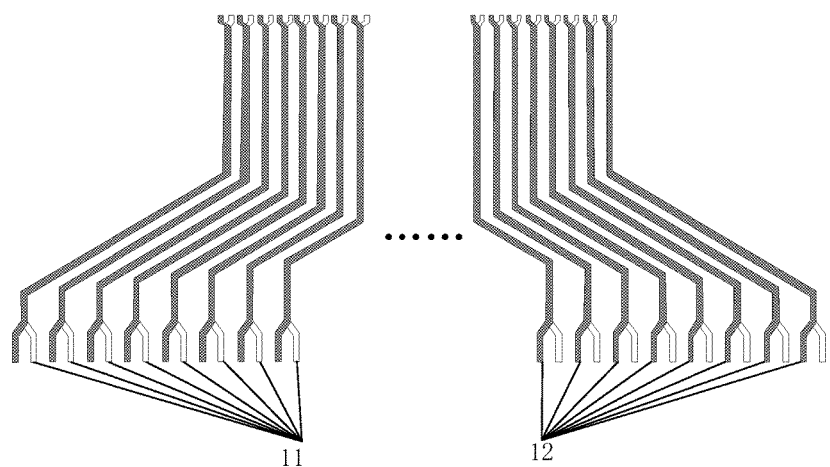
FIG. 2 is a schematic structural view of another wiring region on an array substrate in the related art.

In order to reduce the area of the wiring region, a structure shown in FIG. 2 is proposed in which leading wires in different layers, i.e., leading wires 11 and leading wires 12 are arranged to be overlapped and two overlapped leading wires are used to connect adjacent data lines. This design greatly reduces a space occupied by the wiring region. However, in a case where data signals introduced through the leading wires are inverted in a way of column inversion or dot inversion, since the adjacent leading wires have opposite polarities, with this structure, very large capacitance will be generated between the leading wires overlapped up and down, which may increase power consumption and affect image quality.

In order to solve the above problem, some embodiments of the disclosure provide an array substrate comprising a display region provided with a plurality of data lines therein and a wiring region around the display region and provided with a plurality of leading wires for data lines therein. The plurality of leading wires are connected with the plurality of data lines respectively in a one-to-one correspondence way. The plurality of leading wires comprise a plurality of first leading wires and a plurality of second leading wires insulatively arranged in different layers, the plurality of first leading wires are located in the same layer, and the plurality of second leading wires are located in the same layers. An insulation layer is arranged between the plurality of first leading wires and the plurality of second leading wires. The plurality of first leading wires and the plurality of second leading wires comprise at least one pair of up-and-down overlapped first and second leading wires through which data signals having the same polarity are introduced.

Since data signals having the same polarity are introduced through the up-and-down overlapped first and second leading wires, it is possible to reduce capacitance between the up-and-down overlapped first and second leading wires, thereby reducing power consumption and improving image quality.

In some embodiments of the disclosure, the data lines are arranged in column. The column inversion herein refers to data signals input to adjacent data lines have opposite polarities, and the dot inversion herein refers to data signals input to adjacent sub-pixels have opposite polarities.

Figure 3:
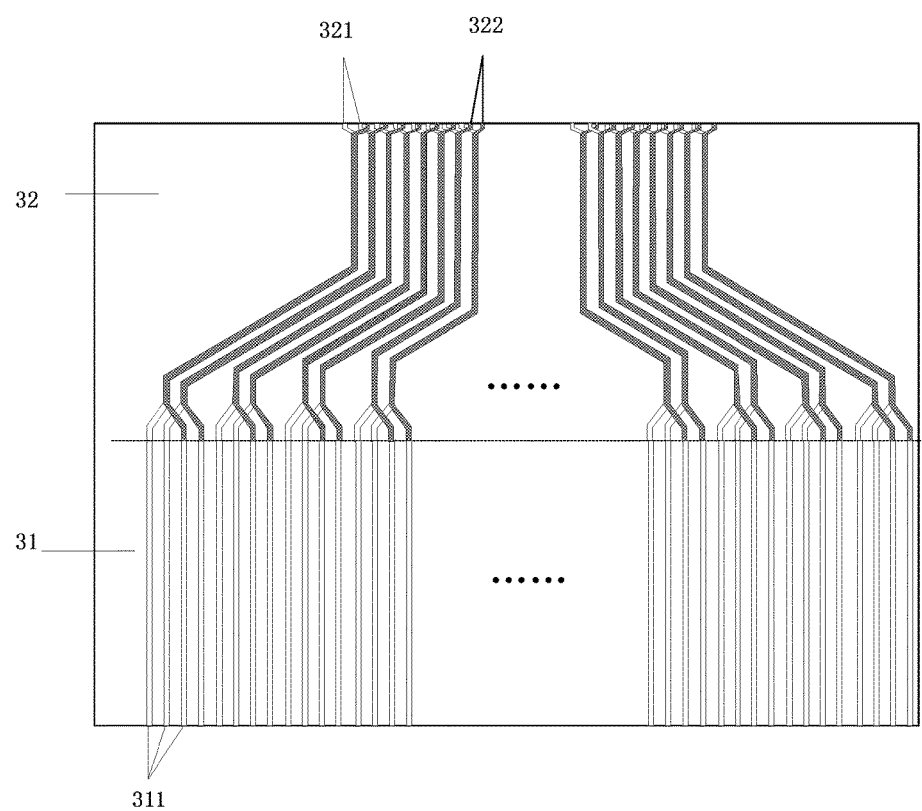
FIG. 3 is a schematic structural view of an array substrate according to some embodiments of the disclosure.

Please refer to FIG. 3, FIG. 3 is a schematic structural view of an array substrate according to some embodiments of the disclosure. An array substrate according to some embodiments of the disclosure comprises a display region 31 and a wiring region 32 around the display region. The display region 31 is provided with a plurality of data lines 311 therein, and the wiring region 32 is provided with a plurality of leading wires connected to the plurality of data lines 311 respectively in a one-to-one correspondence way. The plurality of leading wires include a plurality of first leading wires 321 and a plurality of second leading wires 322 insulatively arranged in different layers. The plurality of first leading wires 321 are located in the same layer, the plurality of second leading wires 322 are located in the same layer, and an insulation layer is arranged between the two layers of leading wires. The plurality of first leading wires 321 and the plurality of second leading wires 322 include at least one pair of first leading wire 321 and second leading wire 322 overlapped up and down. Two data lines 311 connected with the up-and-down overlapped first leading wire 321 and second leading wire 322 are both odd-numbered data lines or even-numbered data lines.

The polarities between two adjacent data lines are opposite to each other. Since the two data lines connected with the up-and-down overlapped first leading wire 321 and second leading wire 322 are both odd-numbered data lines or even-numbered data lines, when data signals are inverted in a way of column inversion or dot inversion, the up-and-down overlapped first leading wire 321 and second leading wire 322 have the same polarities, which results in reduced capacitance between the up-and-down overlapped first leading wire 321 and second leading wire 322, thereby reducing power consumption and improving image quality.

In some embodiments of the disclosure, one of the first leading wires 321 and the second leading wires 322 may be arranged in the same layer as the data lines 311 for a convenient connection, and the other one may be arranged in a different layer from the data lines 311 and connected with the data lines 311 through via holes.

Of course, in some embodiments of the disclosure, both the first leading wires 321 and the second leading wires 322 may be arranged in a different layer from the data lines 311 and connected with the data lines through via holes.

Please refer to FIG. 3, in an embodiment, two data lines 311 connected with the up-and-down overlapped first leading wire 321 and second leading wire 322 are interleaved with one data line 311 for a convenient wiring. That is, there is one data line 311 between two data lines 311 connected with the up-and-down overlapped first leading wire 321 and second leading wire 322. For example, the two data lines 311 connected with the up-and-down overlapped first leading wire 321 and second leading wire 322 are respectively the first column data lines and the third column data lines.

Of course, in some embodiments of the disclosure, there may be more than one data lines between two data lines 311 connected with the up-and-down overlapped first leading wire 321 and second leading wire 322. For example, the two data lines 311 connected with the up-and-down overlapped first leading wire 321 and second leading wire 322 may be the first column data line and the fifth column data line, respectively.

Figure 4:
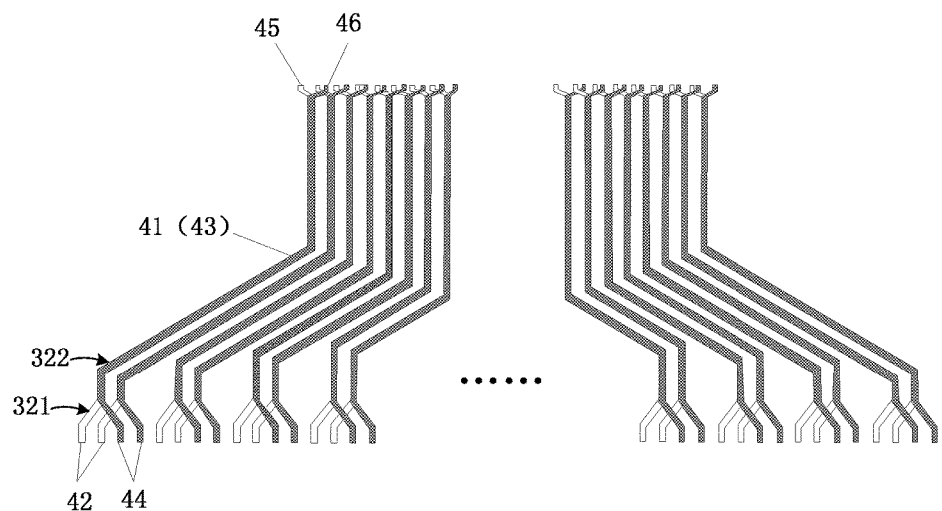
FIG. 4 is a schematic structural view of leading wires for data lines according to some embodiments of the disclosure.

Please refer to FIG. 4, FIG. 4 is a schematic structure view of the leading wires according to some embodiments of the disclosure. Each of the first leading wires 321 includes a leading wire body 41 and a first bended connection end 42 for connecting with a data line, and each of the second leading wires 322 includes a leading wire body 43 and a first bended connection end 44 for connecting with a data line. A bending direction of the first bended connection end 41 of each first leading wire 321 is opposite to a bending direction of the first bended connection end 44 of each second leading wire 322 and thus the first bended connection end 41 of each first leading wire 321 and the first bended connection end 44 of each second leading wire 322 form a fork shape. The first bended connection end 44 of the second leading wire 322 crosses the first bended connection end 42 of a first leading wire 321 adjacent to the first leading wire overlapped with the second leading wire so as to facilitate connection with the wiring of the data lines.

Please refer to FIG. 4, in an embodiment, each first leading wire 321 further includes a second bended connection end 45 for connecting with a connection terminal of a driving circuit, and each second leading wire 322 further includes a second bended connection end 46 for connecting with a connection terminal of the driving circuit. A bending direction of the second bended connection end 45 of each first leading wire 321 is opposite to a bending direction of the second bended connection end 46 of each second leading wire 322 and thus the second bended connection end 45 of each first leading wire 321 and the second bended connection end 46 of each second leading wire 322 form a fork shape. The second bended connection end 46 of the second leading wire 322 crosses the second bended connection end 45 of a first leading wire 321 adjacent to the first leading wire overlapped with the second leading wire so as to facilitate connection with the wiring of the connection terminal of the driving circuit.

Figure 5:
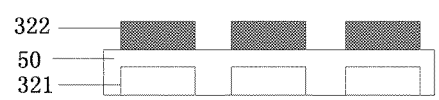
FIG. 5 is a schematic structural cross-section view of the leading wires in FIG. 3.

In some embodiments of the disclosure, the first leading wires 321 may have the same number of leading wires as the second leading wires 322, and each first leading wire 321 corresponds to one second leading wire 322 overlapped therewith. Please refer to FIG. 5, in FIG. 5, an insulation layer between the first leading wires 321 and the second leading wires 322 is denoted by the reference numeral 50.

Figure 6:
FIG. 6 is a schematic structural cross-section view of leading wires according to some embodiments of the disclosure.

Of course, in some embodiments of the disclosure, the first leading wires 321 may have different number of leading wires from the second leading wires 322. Please refer to FIG. 6, the first leading wires 321 have more leading wires than the second leading wires 322 such that there are no second leading wires 322 overlapped with some of the first leading wires 321.

In the above embodiments, the first leading wires 321 may have the same width as the second leading wires 322.

Figure 7:
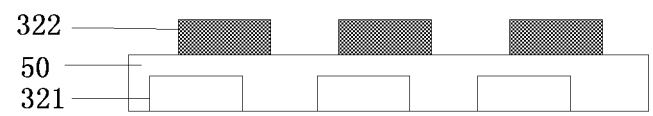
FIG. 7 is a schematic structural cross-section view of leading wires according to some embodiments of the disclosure.

In the above embodiments, a leading wire body of each first leading wire 321 is completely overlapped with a leading wire body of each second leading wire 322, i.e., orthogonal projections thereof on a base substrate of an array substrate are completely overlapped, thereby effectively reducing the area of the wiring region. Of course, in some embodiments of the disclosure, the leading wire body of each first leading wire 321 may be partially overlapped with the leading wire body of each second leading wire 322, as shown in FIG. 7.

Figure 8:
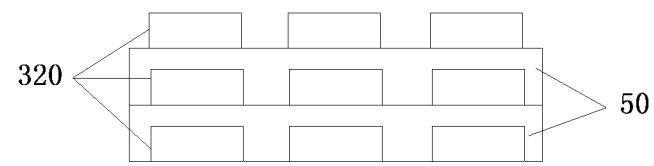
FIG. 8 is a schematic structural cross-section view of leading wires according to some embodiments of the disclosure.

In some embodiments of the disclosure, the wiring region comprises two layers of leading wires for data lines. In other embodiments of the disclosure, the wiring region may include more layers of leading wires, for example, three layers, four layers and the like. Please refer to FIG. 8, the wiring region comprises three layers of leading wires 320 overlapped with each other. An insulation layers 50 is interposed between each two adjacent layers of leading wires 320. The three data lines connected with the three overlapped leading wires are all odd-numbered data lines or all even-numbered data lines so that when the introduced data signals are inverted in a way of column inversion or dot inversion, the data signals introduced through the three overlapped leading wires have the same polarity, which may result in reduced capacitance between the overlapped leading wires, thereby reducing the power consumption and improving the image quality.

Some embodiments of the disclosure also provide a display panel comprising the array substrate according to any one of the above embodiments.

Some embodiments of the disclosure also provide a display device comprising the display panel as described above and a driving circuit. The driving circuit comprises a plurality of connection terminals connected to the plurality of leading wires for data lines respectively in a one-to-one correspondence way. The driving circuit is configured to input data signals having the same polarity to the up-and-down overlapped first and second leading wires through the connection terminals.

Some embodiments of the disclosure also provide a display method for use with the above display device, the method comprising: inputting data signals having the same polarity to the up-and-down overlapped first and second leading wires.

With the array substrate, the display panel, the display device and the display method according to the above embodiments, since data signals having the same polarity are input to the overlapped leading wires for data lines, it is possible to reduce capacitance between the overlapped leading wires, thereby reducing power consumption and improving image quality.

Some implementations of the disclosure have been disclosed above. It should be noted for those ordinary skilled in the art that various changes or modifications can be made without departing from the spirit and scope of the disclosure, and these changes or modifications should fall within the scope of the disclosure.

What is claimed is:
1. An array substrate comprising:
    a display region provided with a plurality of data lines therein; and
    a wiring region located around the display region and provided with a plurality of leading wires therein, wherein:
        the plurality of leading wires are connected with the plurality of data lines respectively in a one-to-one correspondence way;
        the plurality of leading wires comprise a plurality of first leading wires and a plurality of second leading wires, which are insulatively arranged in different layers; and the plurality of first leading wires and the plurality of second leading wires comprise at least one pair of up-and-down overlapped first and second leading wires to which data signals having the same polarity are input, wherein:

each of the first and second leading wires comprises a leading wire body and a first bended connection end for connecting with a data line;

the leading wire body of each first leading wire is up-and-down overlapped with that of each corresponding second leading wire;

the first bended connection end of each first leading wire has a bending direction opposite to a bending direction of the first bended connection end of each corresponding second leading wire; and the first bended connection end of each second leading wire crosses a first bended connection end of another first leading wire adjacent to a corresponding first leading wire overlapped with the second leading wire.

2. The array substrate according to claim 1, wherein two data lines connected with the up-and-down overlapped first and second leading wires are both odd-numbered data lines or even-numbered data lines.

3. The array substrate according to claim 2, wherein two data lines connected with the up-and-down overlapped first and second leading wires are interleaved with at least one data line therebetween.

4. The array substrate according to claim 3, wherein two data lines connected with the up-and-down overlapped first and second leading wires are interleaved with one data line therebetween.

5. The array substrate according to claim 1, wherein each of the first and second leading wires further comprises a second bended connection end for connecting with a connection terminal of a driving circuit;

the second bended connection end of each first leading wire has a bending direction opposite to a bending direction of the second bended connection end of each corresponding second leading wire; and the second bended connection end of each second leading wire crosses a second bended connection end of another first leading wire adjacent to the corresponding first leading wire overlapped with the second leading wire.

6. The array substrate according to claim 1, wherein data signals having opposite polarities are introduced to two adjacent data lines respectively.

7. The array substrate according to claim 1, wherein the first leading wires have the same number of leading wires as the second leading wires, and each first leading wire corresponds to one second leading wire overlapped therewith.

8. The array substrate according to claim 1, wherein the first leading wires have the same width as the second leading wires.

9. The array substrate according to claim 1, wherein the first leading wires have different numbers of leading wires from the second leading wires.

10. The array substrate according to claim 1, further comprising a base substrate, wherein orthogonal projections of the up-and-down overlapped first and second leading wires on the base substrate of the array substrate are at least partially overlapped with each other.

11. The array substrate according to claim 10, wherein the orthogonal projections of the leading wire bodies of the up-and-down overlapped first and second leading wires on the base substrate of the array substrate are completely overlapped with each other.

12. The array substrate according to claim 1, wherein the first leading wires are arranged in the same layer as the data lines, and the second leading wires are connected with the data lines through via holes.

13. The array substrate according to claim 1, wherein the data lines are arranged in a different layer from the first and second leading wires, and the first and second leading wires are connected with the data lines through via holes.

14. A display panel comprising the array substrate according to claim 1.

15. The display panel according to claim 14, wherein two data lines connected with the up-and-down overlapped first and second leading wires both are odd-numbered data lines or even-numbered data lines.

16. The display panel according to claim 15, wherein two data lines connected with the up-and-down overlapped first and second leading wires are interleaved with at least one data line therebetween.

17. The display panel according to claim 16, wherein two data lines connected with the up-and-down overlapped first and second leading wires are interleaved with one data line therebetween.

18. A display device comprising the display panel according to claim 14 and a driving circuit, the driving circuit comprising a plurality of connection terminals connected with the plurality of leading wires respectively in a one-to-one correspondence way, wherein the driving circuit is configured to input data signals having the same polarity to the up-and-down overlapped first and second leading wires through the connection terminals.

19. A display method for use with the display device according to claim 18, comprising:

inputting data signals having the same polarity to the up-and-down overlapped first and second leading wires.

* * * * *